United States Patent [19]

Buchheit

[11] 4,433,297
[45] Feb. 21, 1984

[54] TIME AVERAGED AMPLITUDE COMPARISON ELECTROMETER

[75] Inventor: Robert F. Buchheit, Webster, N.Y.

[73] Assignee: Xerox Corporation, Stamford, Conn.

[21] Appl. No.: 276,235

[22] Filed: Jun. 22, 1981

[51] Int. Cl.³ ............................................ G01R 29/12
[52] U.S. Cl. .............................. 324/457; 355/14 CH; 355/3 R
[58] Field of Search ............ 355/14 CH, 3 R; 324/72, 324/72.5, 457, 458, 452

[56] References Cited

U.S. PATENT DOCUMENTS

| | | | |
|---|---|---|---|
| 3,525,936 | 8/1970 | Vosteen | 324/72 |
| 3,667,036 | 5/1972 | Seachman | 324/72 |
| 3,729,675 | 4/1973 | Vosteen | 324/72 |
| 3,944,354 | 3/1976 | Benwood et al. | 355/3 |
| 4,167,325 | 9/1979 | Plumadore | 355/14 CH |
| 4,249,131 | 2/1981 | Owen | 324/457 |
| 4,355,885 | 10/1982 | Nagashima | 324/457 |

*Primary Examiner*—Michael J. Tokar
*Attorney, Agent, or Firm*—Ronald F. Chapuran

[57] ABSTRACT

The present invention is an electrometer probe disposed adjacent a photosensitive surface, the electrometer head providing an input amplifier that functions as a comparator to compare the voltage level on the photosensitive surface with a variable high voltage DC power supply. Control circuitry receives the output of the electrometer probe and in response to the signal adjusts the variable high voltage reference supply voltage. The control circuit adjusts the supply voltage to maintain the voltage at a ratio of time above (or below) total time as selected by a selection switch, for example 5 percent, 50 percent or 95 percent.

11 Claims, 11 Drawing Figures

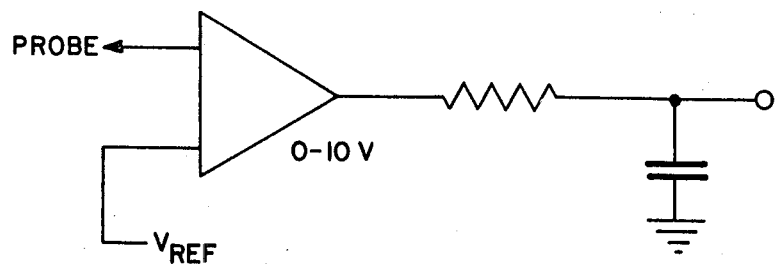
FIG. 3
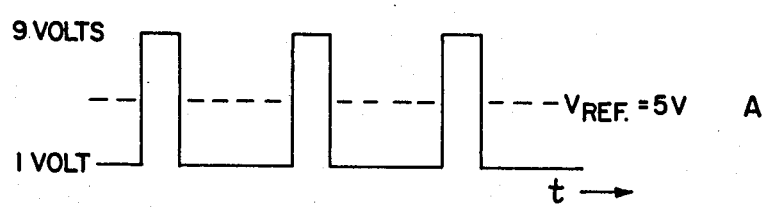
FIG. 4
(PROBE VOLTAGE SIGNALS)
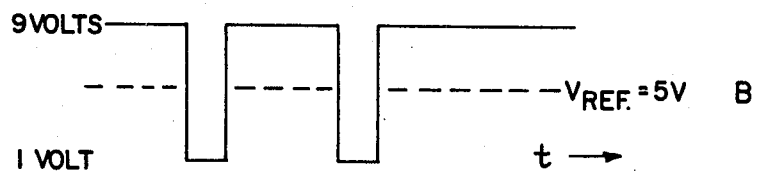
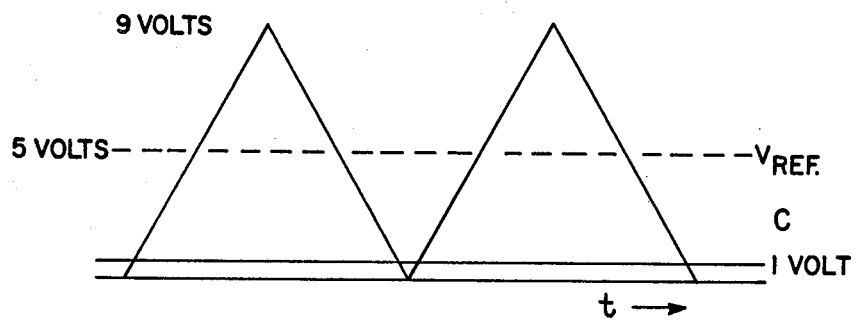

COMPARATOR OUTPUT VOLTAGE LEVELS FOR SIGNAL INPUTS OF FIG. 4 AND WITH $V_{REF}$ = 5V D.C (CASE I)

DURING TURN ON (START UP)
OUTPUT IS AT 0 VOLTS (CASE II)

TIME AVERAGED AMPLITUDE COMPARISON ELECTROMETER

This invention relates to electrostatic reproduction machines and more particularly to an improved technique for measuring the voltage level on the photoreceptor of the reproduction machine.

In reproduction machines using an endless belt type photosensitive surface, the belt usually contains more than one image at one time as it moves through various processing stations. The portions of the photosensitive surface containing the projected images, referred to as image areas, are usually separated by a portion of the photosensitive surface called the interdocument space. After charging of the photosensitive surface to a suitable charge level by a corotron, the interdocument space area of the photosensitive surface is generally discharged by a suitable lamp to avoid attracting toner particles at the development station.

Various portions of the photosensitive surface, therefore, will be charged to different voltage levels. For example, there will be the high voltage level of the initial charge on the photosensitive surface, a selectively discharged image area of the photosensitive surface, and a fully discharged portion of the photosensitive surface between the image areas.

A useful tool for measuring voltage levels on the photosensitive surface is an electrostatic voltmeter or electrometer. The electrometer is generally rigidly secured to the reproduction machine adjacent the moving photosensitive surface and measures the voltage level of the photosensitive surface as it traverses the electrometer probe.

However, as the moving photosensitive surface traverses the electrometer probe, the electrometer will provide a rapidly changing or fluctuating voltage level signal due to the various voltage levels on the photosensitive surface. Such a signal is generally not useful to be able to determine a specific voltage level such as the high charge level, the interdocument space level or the image area level.

Techniques are available to read the voltage only at a specific portion of the photosensitive surface such as by precise timing of the reading of the electrometer at a specific portion of the photosensitive surface. Of course, such methods are complicated by the need for precise timing control. Even with such precise timing control, due to imperfections at specific locations of the photosensitive surface or due to externally generated noise spikes, an imperfect signal may in fact be read by the electrometer.

It would therefore be desirable to provide a simple, economical voltage level measuring technique that compensates for photosensitive surface imperfections and externally generated noise to provide a reliable and useful voltage signal. It would also be desirable to provide a reliable, accurate voltage level signal that can be used to automatically control machine parameters or used by a service representative to make field adjustments to the reproduction machine.

It is therefore a principle object of the present invention to provide a new and improved voltage level measuring technique that is simple, economical and provides a reliable voltage level signal using a time averaged amplitude comparison technique.

Further objects and advantages of the invention will become apparent as the following description proceeds and the features of novelty characterizing the invention will be pointed out with particularity in the claims annexed to and forming a part of this specification.

Briefly, the present invention is concerned with an electrometer probe or head disposed adjacent the photosensitive surface, the electrometer head providing an input amplifier that functions as a comparator to compare the voltage level on the photosensitive surface with a variable high voltage DC power supply. Control circuitry receives the output of the electrometer head and in response to the signal, adjusts the variable high voltage reference supply voltage. The control circuit adjusts the supply voltage to maintain the voltage at a ratio of time above (or below) total time as selected by a selector switch, for example, 10 percent, 50 percent or 90 percent. This time averaging procedure will take a variable voltage level and provide a reading of the maximum voltage level, the minimum voltage level, or any other desired voltage level. The control circuitry comprises a comparator having one input from the selector switch electrically connected to a voltage divider network and a second input from the electrometer head. The output of the comparator is connected to an RC filter network in turn connected to the high voltage supply.

Other objects and advantages of the present invention will become apparent upon reading the following detailed description and upon reference to the drawings wherein the same reference numerals have been applied to like parts wherein:

FIG. 3 is a typical comparator circuit with RC filter network illustrating the principle of voltage time averaging;

FIG. 4 and FIG. 5 illustrate various voltage level signals into and out of the comparator of FIG. 3;

Figure 1:
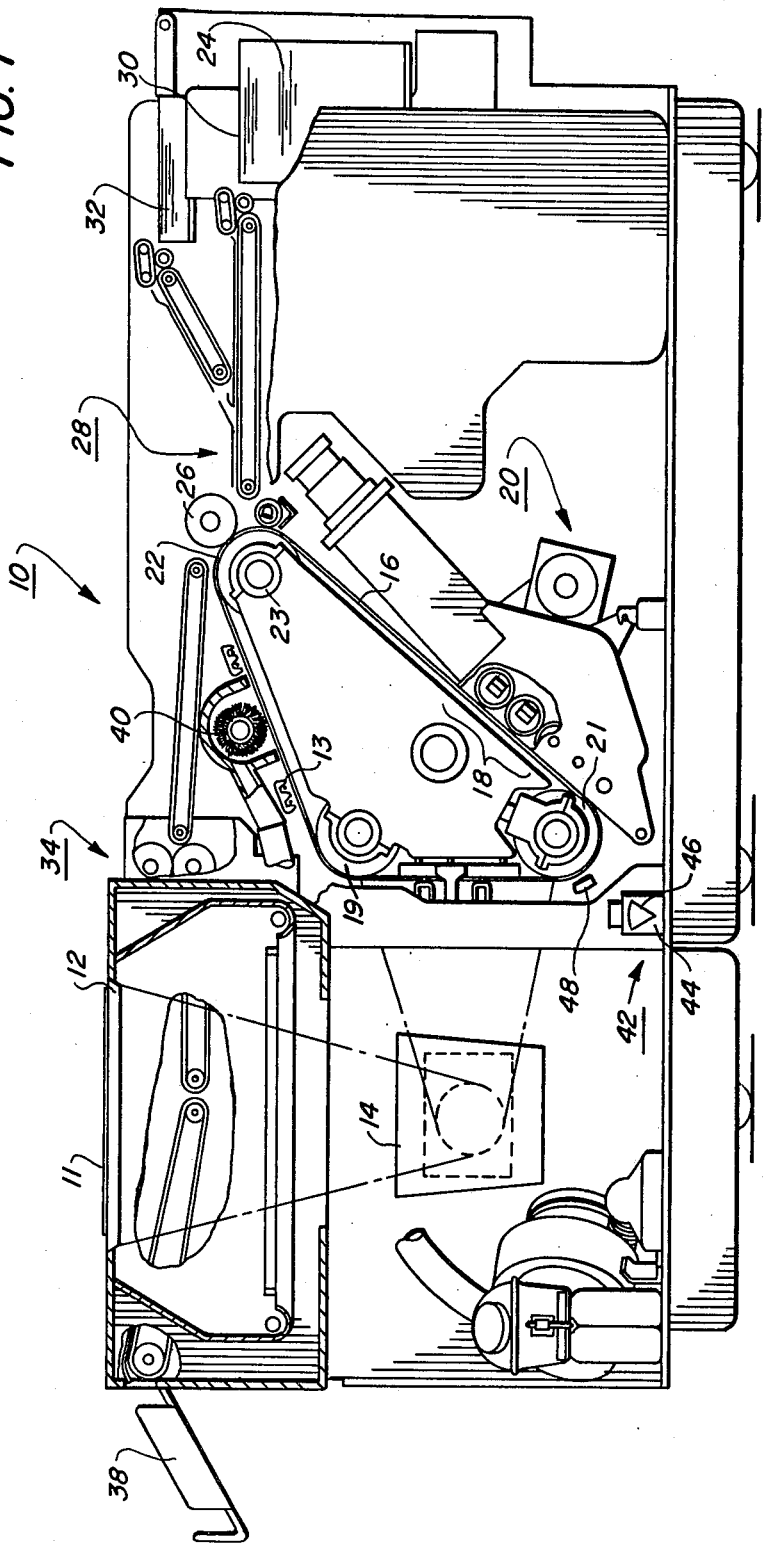
FIG. 1 is a schematic elevational view representing an exemplary reproduction machine incorporating the present invention.

With reference to FIG. 1, there is generally shown a reproduction machine 10 incorporating the present invention. A document 11 to be copied is placed upon a transparent support platen 12 rigidly supported in an illumination assembly. A corona generating device 13 uniformly charges the photosensitive surface of a flexible photoconductive belt 16. Document image rays are projected by means of an optical system generally shown at 14, comprising a lens and mirror, onto the photosensitive surface.

The belt 16 is mounted for continuous movement upon three rollers 19, 21 and 23 positioned with their axes in parallel. The electrostatic latent image on the moving belt 16 passes through a developing station 18 in which there is positioned a magnetic brush developing apparatus, generally indicated by the reference numeral 20.

The developed electrostatic image is carried on belt 16 to transfer station 22 to receive a sheet 24 of copy paper. The copy paper is fed between transfer roller 26 and belt 16 at a speed in synchronism with the moving belt. A copy sheet transport mechanism, generally indicated at 28, brings copy sheets 24 from paper supply trays 30 and 32 to the transfer station 22.

Following transfer, the image bearing sheet is separated from belt 16 and conveyed to a fuser assembly, generally indicated by the reference numeral 34, wherein the developed powder image on the sheet is permanently affixed thereto. After fusing, the finished copy is discharged from the apparatus into a suitable collector tray 38. Residual toner particles and any other residue left on belt 16 are removed brush 40.

As will be understood by those skilled in the art, development of the latent electrostatic image formed on belt 16 is dependent upon the voltage differential between the projected light image on the surface of belt 16 and the developing apparatus 20. This voltage differential attracts toner to the latent electrostatic image to faithfully reproduce the original being copied. The characteristics of this voltage differential may change with machine use and age.

To insure optimum machine performance during the machine service life, adjustment of the machine components affecting the voltage differential are often made. For example, servicing may include adjusting of the power input to the corona generating device 13 or adjusting the voltage bias level at the magnetic brush developing apparatus.

To make these adjustments it is necessary to have voltage level measurements at the photosensitive surface of belt 16. Such a measuring device is an electrostatic voltage measuring device, often called an electrometer and designated herein by the numeral 42. Electrometer 42 generally consists of a main body 44 and probe 48 operably interconnected by suitable electrical connection. Electrometer 42 may also include a meter 46 to indicate visually the voltage being read. The electrometer 42 may be used automatically or manually by a service representative.

Figure 2A:
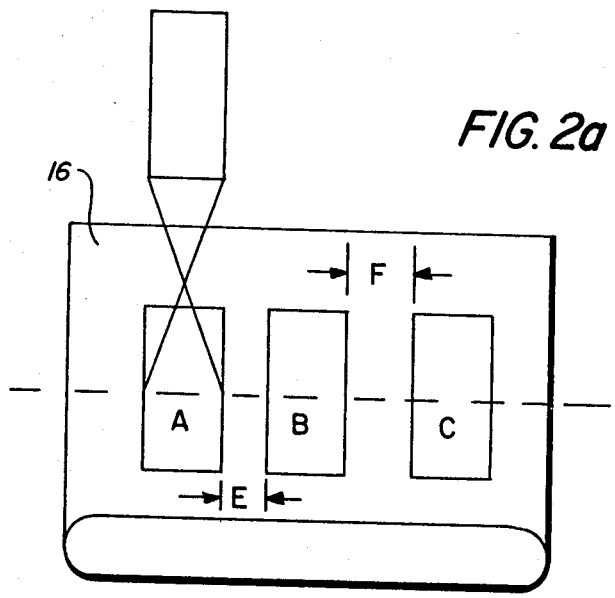
FIG. 2 is a representation of the image and interdocument areas of the photosensitive surface and the corresponding voltage levels.
Figure 2B:
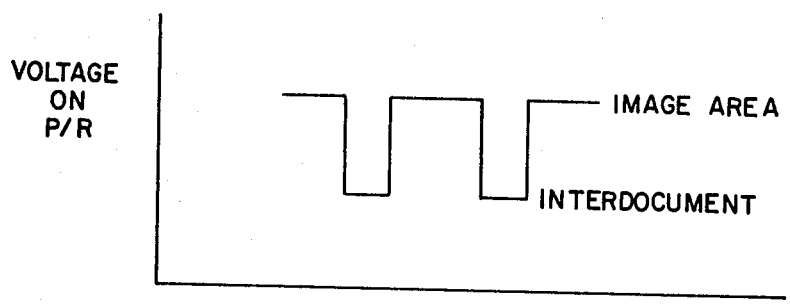

With reference to FIG. 2a, there is illustrated the photoconductive web 16 containing projected images A, B and C with interdocument spaces E and F. FIG 2b also illustrates the voltage level on the photosensitive surface with the high voltage level corresponding to the voltage level of the image areas and the low voltage level corresponding to the discharged portion of the photosensitive surface comprising the interdocument space. To adjust the operation of the reproduction machine, it is desirable to monitor these voltage levels. However, since the photosensitive surface rapidly moves past the electrometer probe 48, discrete voltage levels are not measured, but rather the electrometer produces a rapidly fluctuating signal. This signal is not suitable for automatically adjust machine components or appropriate to be measured by a service representative to make needed adjustments.

To understand the technique for isolating these discrete voltage levels for measurement, reference is made to FIG. 3, showing a comparator connected to a suitable RC filter. One input to the comparator is from the electrometer probe and the other input is from a voltage reference source.

Assume that the voltage probe 48 reads three different voltage waveforms, A, B and C as illustrated in FIG. 4. The peak amplitude is nine volts and the minimum amplitude is one volt in each of the three waveforms. The voltage forms are shown as a function of time. Also, as illustrated, in waveform A there is approximately one time period for the voltage level of nine volts for each four time periods of the voltage level of one volt, in waveform B there are four time periods at a voltage level of 9 for each one time period at a voltage level of one, and in waveform C the average voltage level is five volts.

Figure 5:
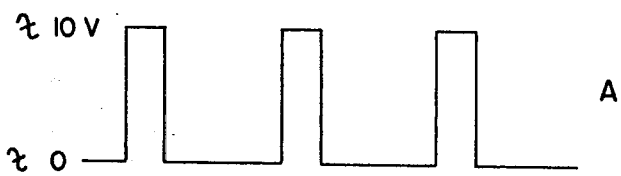
Figure 5:
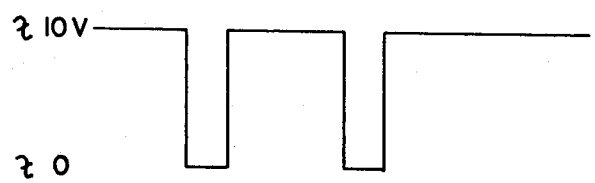
Figure 5:
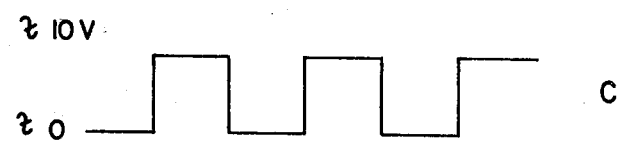

Again with reference to FIG. 3, assume that the reference voltage $V_{ref}$ is five volts and the reference voltage level is negative with respect to the voltage probe. The output of the comparator, therefore, will be positive whenever the voltage probe voltage level is positive with respect to the reference voltage, that is, the voltage level is greater than five volts. The comparator output voltage level corresponding to the voltage probe 48 levels are illustrated in FIG. 5 as A, B and C. The A and B waveforms correspond identically to the input A and B waveforms, but since half the voltage level of this input C waveform is above five and half below five, the output of the comparator is the square wave illustrated in FIG. 5.

Figure 6:
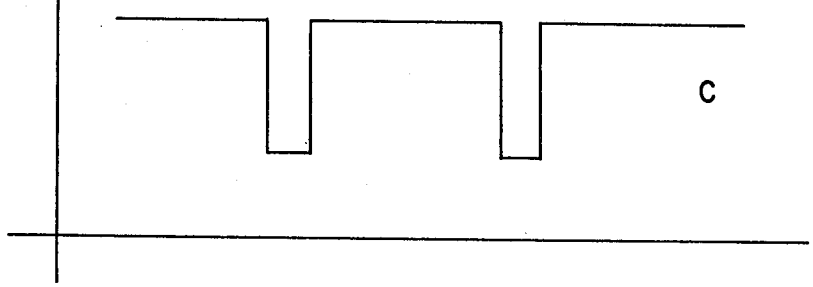
FIG. 6 represents various signals illustrating a change in reference voltage level to the comparator of FIG. 4.

Assume on the other hand, that the reference voltage is 1.1 volts. That is, the output of the comparator is a positive signal whenever the voltage probe reads a voltage level above 1.1 volts. Here again, waveforms A and B are identical to the corresponding input probe waveforms A and B. The output of the comparator, however, corresponding to the input waveform C is as illustrated in FIG. 6. The voltage is substantially at the high level because the majority of the time the waveform C of FIG. 4 is above the 1.1 volt level.

Figure 7A:
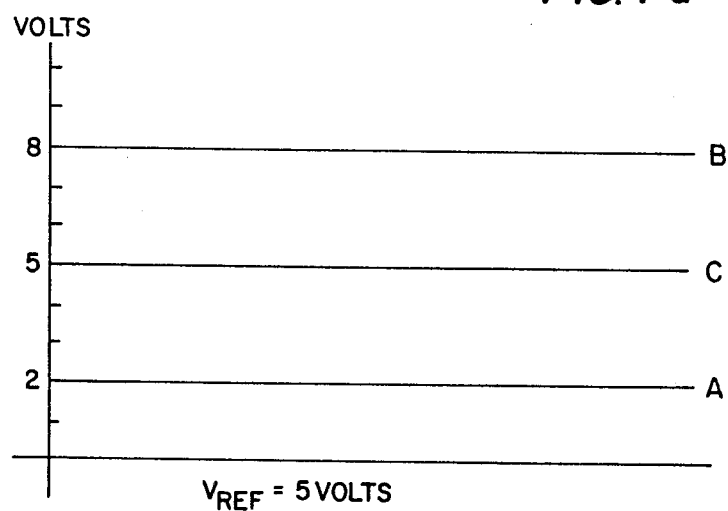
FIG. 7 is a representation of waveforms to the high voltage power supply in accordance with the present invention.
Figure 7B:
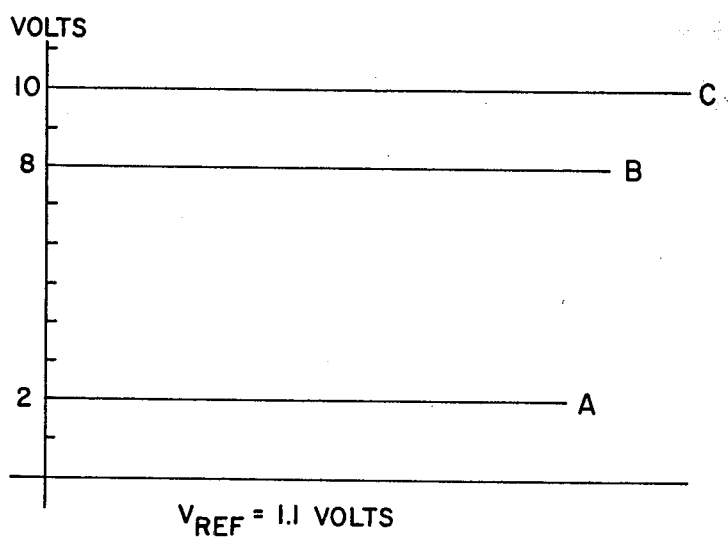

FIG. 7a illustrates the output voltage waveforms from the RC filter network 62. For example, the top three waveforms A, B and C correspond to the output with a reference voltage of five volts. That is, the output corresponding to the input A waveform is generally a constant two volts, that is $$(10 \times 0.2 = 2)$$

wherein 10 is the maximum comparator output voltage and 0.2 represents 20 percent of time above the five volt reference. The output for the input B waveform is a generally constant eight volts, $$(10 \times 0.8 = 8)$$

wherein 0.8 represents 80 percent of time above the five volt reference and the output for the C waveform is a generally constant five volts $$(10 \times 0.5 = 5)$$

where 0.5 represents 50 percent of time above the five volt reference. On the other hand, in FIG. 7b, for a reference voltage of 1.1 volts, the bottom waveforms A, and B illustrate an output of two volts and eight volts. The C waveform is almost a constant 10 volts. As illustrated by waveform C, if the reference voltage is established at near the minimum voltage level, using a time averaged comparison, the output will nearly equal the maximum comparator output voltage level. In a similar manner, by chosing a very high reference voltage, the output can be made to approximate the minimum comparator output voltage level.

Figure 8:
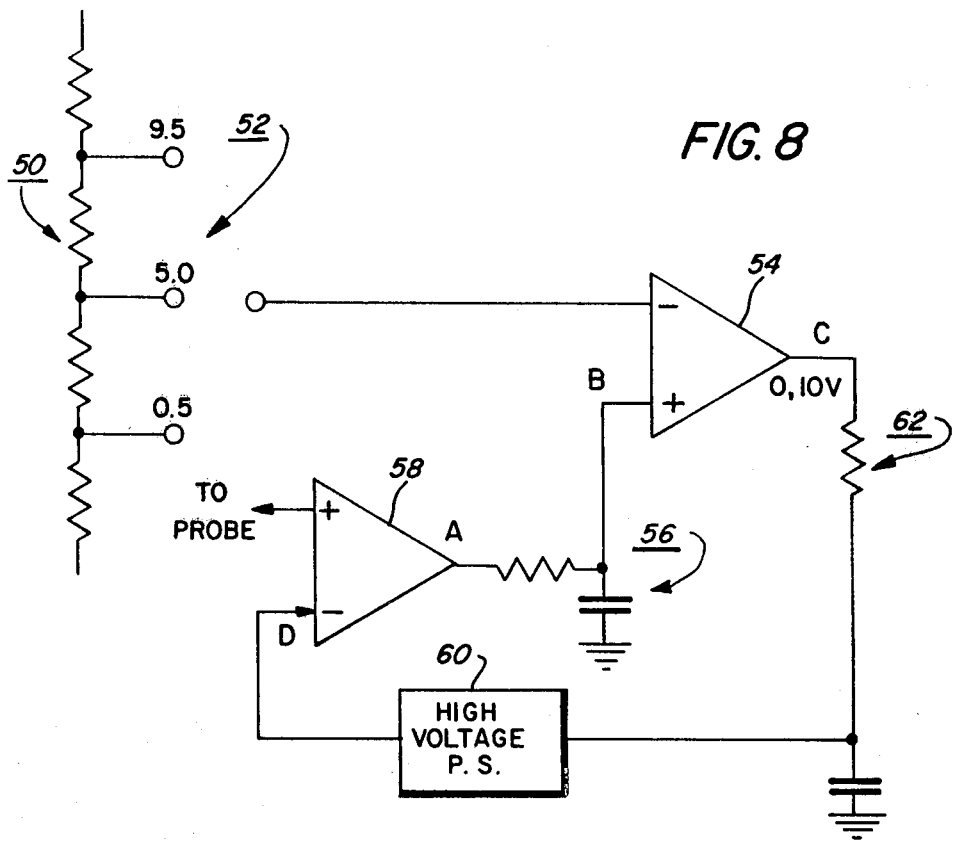
FIG. 8 is a representation of the control circuitry in accordance with the present invention.

The control circuitry in accordance with the present invention is illustrated in FIG. 8 showing a voltage divider network 50 communicating with a selector switch 52 that provides one input to a comparator 54. The other input to the comparator 54 is the output of the RC network 56 connected to comparator 58. The output of the comparator 54 is connected to the variable high voltage DC power supply 60 through another RC filter network 62. The output of the variable high voltage DC power supply 60 provides a reference voltage for the probe or electrometer head connected to comparator 58. It should be noted that an electrometer input amplifier functions as a comparator represented as comparator 58, to compare the voltage sensed by the probe against the variable high voltage DC power supply 60. The input to the comparator 54 from the selector switch 52 is the same polarity as the input from the comparator 58. The three positions of the selector switch 52 at the voltage divider are either a 9.5 volt level, a 5.0 volt level or a 0.5 volt level. These voltage levels are merely for ease of explanation. The output of the comparator 54 is assumed to be zero volts or 10 volts depending upon whether the electrometer probe voltage is greater or less than the reference voltage set at the switch 52.

As an example of the time averaged amplitude comparison technique, assume that the selector switch is set at the 5.0 volt level. It can be demonstrated, therefore, that the reference voltage or the output of the variable high voltage DC power supply 60 can be adjusted to read five volts. That is, the photoreceptor voltage will be greater than five volts one half the time and less than five volts the other half of the time.

Assume that the voltage read by the electrometer probe 48 is as shown in waveform A of FIG. 4 and also assume that initially the output of the variable high voltage power supply 60 is zero volts. Since the voltage waveform at the probe is always positive with respect to the reference voltage input, the output of the electrometer input amplifier 58 will follow a constant value as illustrated by waveform A of FIG. 9. This waveform is illustrated at position A in FIG. 8.

Figure 9:
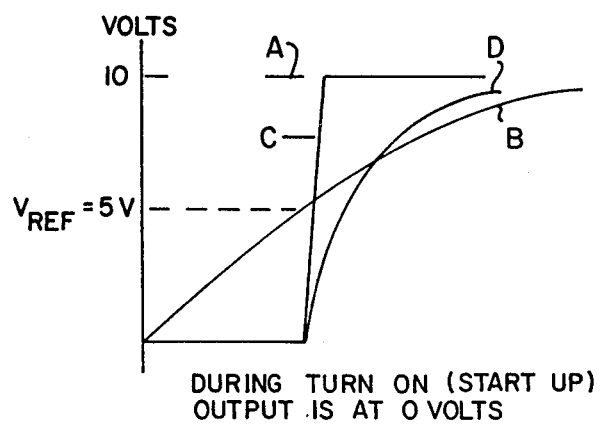
FIGS. 9, 10 and 11 represent voltage signals at various stages in the control circuitry illustrating the present invention.

The signal at location B of FIG. 8 is shown as waveform B in FIG. 9. In other words, the capacitor of RC network 56 tends to charge up to the voltage level of waveform A, to a value of 10 volts. This B waveform is one input to the comparator 54, the other input being the five volt reference voltage from switch 52. The output of the comparator 54 is illustrated at point C in FIG. 8 and shown as waveform C in FIG. 9 is a step voltage. In other words, until the waveform B raises above five volts, there is a zero volt output of the comparator 54. However, during the time that waveform B exceeds five volts, there is a constant ten volt output of the comparator 54. The D waveform, the output of the RC network 62 is illustrated as waveform D in FIG. 9. The waveform D follows the waveform C. As the voltage D to the high voltage power supply increases, there will be more voltage out of the high voltage power supply.

Figure 10:
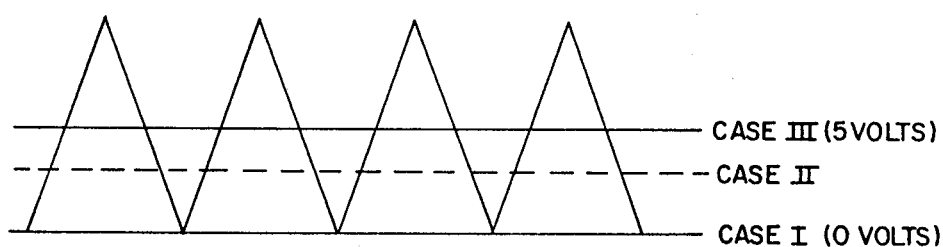

With reference to FIG. 10, we can now assume that the output of the high voltage power supply has risen from case 1 and zero volts to case 2, a level somewhere between zero volts and five volts. With a probe voltage as shown in FIG. 5, waveform A, the output of the electrometer input amplifier 58 will be a pulse voltage as shown by waveform A in FIG. 11. That is, for a certain period of time, the probe voltage will be greater than the reference voltage and provide a positive output at position A in FIG. 8. The rest of the time, the probe voltage will be less than the reference voltage and the output at A will be zero volts.

Figure 11:
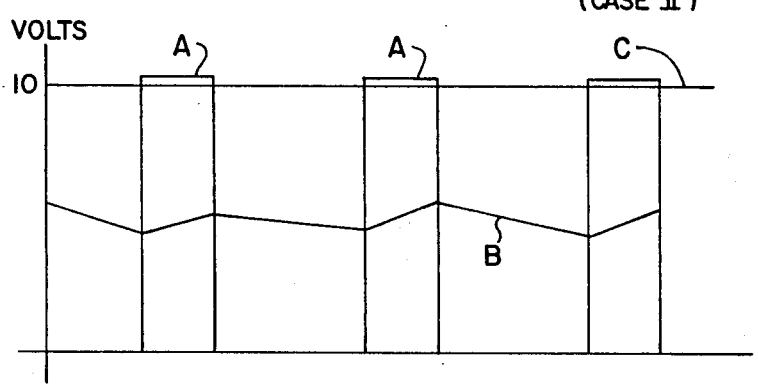

The output of the RC filter 56 as shown by position B is illustrated as waveform B in FIG. 11. That is, during the positive portions of the A waveform, the capacitor will charge, and discharge during the negative portions. Since the waveform B never reaches five volts, the output of the comparator 54 at location C of FIG. 8 will be a constant 10 volts as illustrated in FIG. 11 by waveform C. The output of the RC filter 62 (location D in FIG. 8) tries to follow the waveform at location C and therefore continues to provide more voltage out of the high voltage power supply 60 until the output of the high voltage power supply is five volts.

With the output of the high voltage power supply 60 at five volts, Case III, the output of comparator 58 at location A will be ten volts when the probe voltage is greater than five volts and will be zero volts when the probe voltage is less than five volts. In this example, therefore, since the probe voltage varies between zero and ten volts, there is a 50 percent duty cycle of the waveform at location A. That is, half the time the voltage is greater than five and half the time the voltage is less than five volts. As a consequence, the waveform at location B will average five volts fluctuating half the time above the five volt level and half the time below the five volt level. In a similar manner the output of the comparator 54 at location C switches half the time between ten volts and zero volts. The waveform at location D, therefore, remains at the same output level since the signal at D follows the signal at C.

Therefore, the output of the high voltage power supply 60 remains at five volts. Thus, by setting the selector switch at five volts we are reading a voltage that is the mid-point of the probe voltage. In a similar manner, we can select whatever ratio is desired to balance the waveform at location B and the voltage at the input selector switch 52 to read a time averaged voltage. In other words, we can select a 9.5 voltage of 95 percent ratio. That is, 95 percent of the time above a given level. This in effect, will be the minimum voltage of the fluctuating input probe voltage. In a similar manner, we can select 0.5 voltage level or a 5 percent level below a given voltage to read the peak voltage of the fluctuating input probe voltage.

While there has been illustrated and described what is at present considered to be a preferred embodiment of the present invention, it will be appreciated that numerous changes and modifications are likely to occur to those skilled in the art, and it is intended in the appended claims to cover all those changes and modifications which fall within the true spirit and scope of the present invention.

I claim:

1. Apparatus for measuring charge potentials on an elecrostatic surface comprising
   a voltage divider,
   a selector switch connected to the voltage divider for selecting a voltage level,
   an electrometer probe and input amplifier disposed adjacent the electrostatic surface,
   a variable high voltage power supply communicating with the probe and input amplifier, a voltmeter connected across the variable high voltage power supply to measure a discrete voltage level, and control circuitry including a comparator, the input of the comparator connected to the selector switch and the input amplifier, and a filter network, the output of the comparator connected to the input of the filter network, the output of the filter network connected to the variable high voltage power supply whereby upon suitable selection of voltage levels by the selector switch, the discrete voltage level can be determined in response to variable voltage levels on the electrostatic surface being sensed by the electrometer probe.

2. The apparatus of claim 1 including a resistor capacitor network electrically connecting the input amplifier and the positive terminal of the comparator, the negative terminal of the comparator being connected to the selector switch.

3. The combination of a DC type electrostatic voltmeter for measuring discrete charge potentials of a multi-level charge carried on a moving electrostatic surface, the voltmeter including a stationary probe disposed adjacent the electrostatic surface and in spaced relationship thereto, an electrometer input amplifier electrically connected to the probe, a variable high voltage reference supply voltage communicating with the probe, a function selector providing voltage levels, and a control circuit connected to the function selector, the control circuit adjusting the variable supply voltage to maintain a time ratio of voltage either above or below the voltage level as selected by the function selector.

4. The apparatus of claim 3 including a comparator, the function selector providing a reference voltage and one input to the comparator, the other input to the comparator being provided by the output of the electrometer input amplifier, the output of the comparator connected to the variable high voltage power supply to provide an output voltage from the high voltage power supply to maintain the time ratio of the probe voltage with respect to the reference voltage provided by the function selector.

5. The apparatus of claim 4 wherein the probe voltage is above the reference voltage 95 percent of the time.

6. The apparatus of claim 4 wherein the probe voltage is below the reference voltage 5 percent of the time.

7. The apparatus of claim 4 including a first filter network interconnecting the comparator and the variable high voltage power supply and a second filter network interconnecting the electrometer input amplifier and the comparator.

8. In a reproduction machine having an electrostatic surface charged to various levels and including a voltage selector to provide various discrete voltage levels, the surface moving past a stationary electrometer probe, the method of measuring discrete voltage levels on the electrostatic surface comprising the steps of setting a selector to a discrete reference level, said selector including a control to determine the amount of time the measured voltage on the probe is above or below the reference level, and measuring the output voltage of a variable power supply to determine the discrete voltage level on the electrostatic plate selected by the function selector.

9. The method of claim 8 including the step adjusting the variable power supply to provide an output voltage to balance the probe voltage according to the reference level.

10. The method of claim 9 including the step of setting the reference voltage to a maximum level to determine the minimum level of the fluctuating probe voltage.

11. The method of claim 9 including the step of setting the reference voltage to a minimum level to determine the peak level of the fluctuating probe voltage.

* * * * *